United States Patent
Wise et al.

(10) Patent No.: US 7,767,510 B2
(45) Date of Patent: Aug. 3, 2010

(54) SEMICONDUCTOR DEVICE MADE BY THE METHOD OF PRODUCING HYBRID ORIENTNATION (100) STRAINED SILICON WITH (110) SILICON

(75) Inventors: Rick L. Wise, Fairview, TX (US); Angelo Pinto, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 215 days.

(21) Appl. No.: 11/760,822

(22) Filed: Jun. 11, 2007

(65) Prior Publication Data

US 2008/0303027 A1    Dec. 11, 2008

(51) Int. Cl.
*H01L 21/8238* (2006.01)
(52) U.S. Cl. .................. 438/198; 438/199; 438/455; 438/479; 257/E21.632
(58) Field of Classification Search .......... 438/199, 438/198, 406, 455, 479, 973; 257/E21.632
See application file for complete search history.

(56) References Cited

U.S. PATENT DOCUMENTS

| | | | |
|---|---|---|---|
| 6,911,379 B2* | 6/2005 | Yeo et al. | 438/480 |
| 7,372,107 B2* | 5/2008 | Yeo et al. | 257/353 |
| 2004/0195646 A1* | 10/2004 | Yeo et al. | 257/527 |

* cited by examiner

*Primary Examiner*—Lex Malsawma
(74) *Attorney, Agent, or Firm*—Warren L. Franz; Wade J. Brady, III; Frederick J. Telecky, Jr.

(57) ABSTRACT

There is provided a method of manufacturing a semiconductor device. In one aspect, the method includes providing a strained silicon layer having a crystal orientation located over a semiconductor substrate having a different crystal orientation. A mask is placed over a portion of the strained silicon layer to leave an exposed portion of the strained silicon layer. The exposed portion of the strained silicon layer is amorphized and re-crystallized to a crystal structure having an orientation the same as the semiconductor substrate.

23 Claims, 4 Drawing Sheets

US 7,767,510 B2

SEMICONDUCTOR DEVICE MADE BY THE METHOD OF PRODUCING HYBRID ORIENTNATION (100) STRAINED SILICON WITH (110) SILICON

TECHNICAL FIELD

The invention is directed, in general, to a semiconductor device and to a method of manufacture therefor; and, more specifically, to a semiconductor device and method of producing hybrid orientation (100) strained silicon with (110) silicon.

BACKGROUND

As the semiconductor industry continues to increase performance of integrated circuit devices in accordance with Moore's Law, physical limits of feature size are presenting new challenges to further improvement. For example, transistor gate lengths are approaching a value below which quantum effects cannot be neglected. Without new strategies, such challenges threaten to slow the rate of increase in device performance.

One of these strategies, known as direct silicon bond with hybrid orientation technology (DSB/HOT), results in improved hole mobility for PMOS devices. Another of these strategies, known as strained silicon directly on insulator (sSOI), results in improved electron mobility for NMOS devices. The improvement in electron mobility or hole mobility increases the respective device's speed and overall performance. However, currently these two processes are mutually exclusive.

SUMMARY

In one embodiment, there is provided a method of fabricating a semiconductor device that comprises forming NMOS transistors over and within a (100) strained silicon layer wherein the (100) strained silicon layer is located over a (110) semiconductor substrate. The method further comprises forming PMOS transistors over and within a portion of the (100) strained silicon layer located over the (110) semiconductor substrate, including amorphizing the portion and re-crystallizing the portion to a (110) crystal orientation prior to forming the PMOS transistors. Dielectric layers are formed over the NMOS and PMOS transistors, and interconnects are formed over or within the dielectric layers that connect the NMOS and PMOS transistors to other devices.

In another embodiment, there is provided a method of fabricating a semiconductor device. This embodiment comprises providing a strained silicon layer having a crystal orientation located over a semiconductor substrate having a different crystal orientation. A mask is placed over a portion of the strained silicon layer to leave an exposed portion of the strained silicon layer. The exposed portion of the strained silicon layer is amorphized and re-crystallized to a crystal structure having an orientation the same as the second semiconductor substrate.

In yet another embodiment, there is provided a semiconductor device comprising NMOS transistors located over and within a (100) strained silicon layer wherein the (100) strained silicon layer is located over a (110) semiconductor substrate, and PMOS transistors located over and within the (110) silicon substrate. Dielectric layers are located over the NMOS and PMOS transistors, and interconnects are located over or within the dielectric layers that connect the NMOS and PMOS transistors to other devices.

BRIEF DESCRIPTION OF DRAWINGS

The disclosure is described with reference to example embodiments and to accompanying drawings, wherein.

DETAILED DESCRIPTION

Figure 1A:
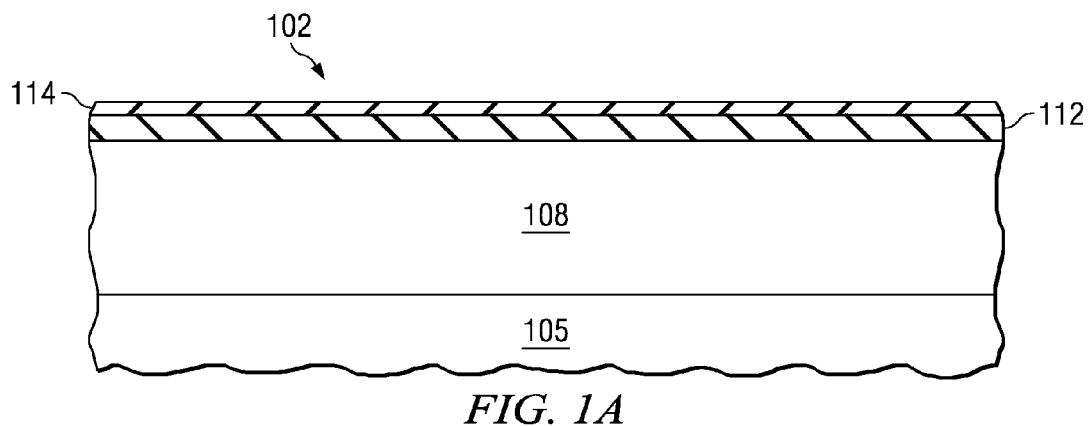
FIGS. 1A-1B illustrate examples of semiconductor substrates that can be used in the invention.

FIG. 1A illustrates an embodiment of a semiconductor substrate 102 that may be used to fabricate a device, as covered by the invention. In this embodiment, the substrate 102 may be a conventional graded germanium, strained silicon substrate that includes a substrate 105 having a (100) crystal orientation. The substrate 105 also includes a doped portion 108 that has been produced by a graded deposition process, wherein a germanium concentration is increased from about 0% to about 15 to 20% atomic percent. A strained silicon layer 112 is formed and located over the doped portion 108. In one embodiment, the strained silicon layer 112 has a (100) crystal configuration, which is the same as substrate 105. The imparted strain results from the differences in the crystalline structure of the doped portion 108 and the silicon layer deposited over the doped portion 108. In such embodiments, the strained silicon layer 112 will typically have a biaxial, tensile stress associated with it, which improves electron mobility in an NMOS device. Conventional processes and materials may be used to form the semiconductor substrate 102. For example, in one embodiment, the doped portion 108 may be doped with $Si_{0.8}Ge_{0.2}$, where the germanium concentration is from about 15% to about 20% by atomic percent.

Figure 1B:
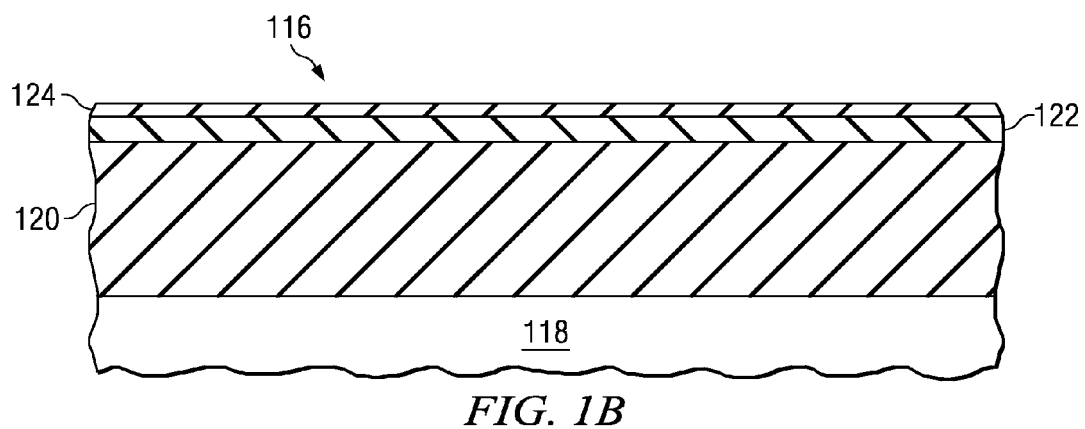

In an alternative embodiment, as shown in FIG. 1B, a conventional sSOI substrate 116 may be commercially obtained and used in place of substrate 102. In such embodiments, the substrate 116 may include a silicon substrate 118 having an oxide layer 120 located thereover. A strained silicon layer 122 is located over the oxide layer 120 and another oxide layer 124 is located over the strained silicon layer 122.

The thickness of the strained silicon layer 112 may vary depending on the depth of the source/drain junctions. The thickness should be deeper than the source/drain junctions but shallower than the shallow trench isolation depth. For example, in one embodiment, the strained silicon layer 112 may have a thickness that ranges from about 100 nm to about 200 nm. Therefore, the thickness of the strained silicon layer 112 should be chosen as a thickness that is compatible with the overall device design and manufacturing parameters. In addition, it is desirable that the thickness not be too thick as to impede its amorphization and re-crystallization, as discussed below.

In another aspect, an oxide layer 114 may be grown over the strained silicon layer 112. The presence of the oxide layer 114 is advantageous in embodiments where the substrate 102 is bonded to another wafer using hydrophilic bonding processes. Conventional processes may also be used to form the oxide layer 114. The oxide layer 114 is unlike conventional silicon-on-insulator (SOI) layers in at least two respects. First, the oxide layer 114 is much thinner than conventional SOI layers in that it is less than a monolayer thick. Conventional SOI layers are often used to isolate the active source/drain and well regions from the underlying substrate to reduce leakage and cross-talk. Second, in conventional processes where strained silicon is placed on the SOI layer, the SOI layer is there to prevent relaxation of the strained silicon layer.

Figure 2:
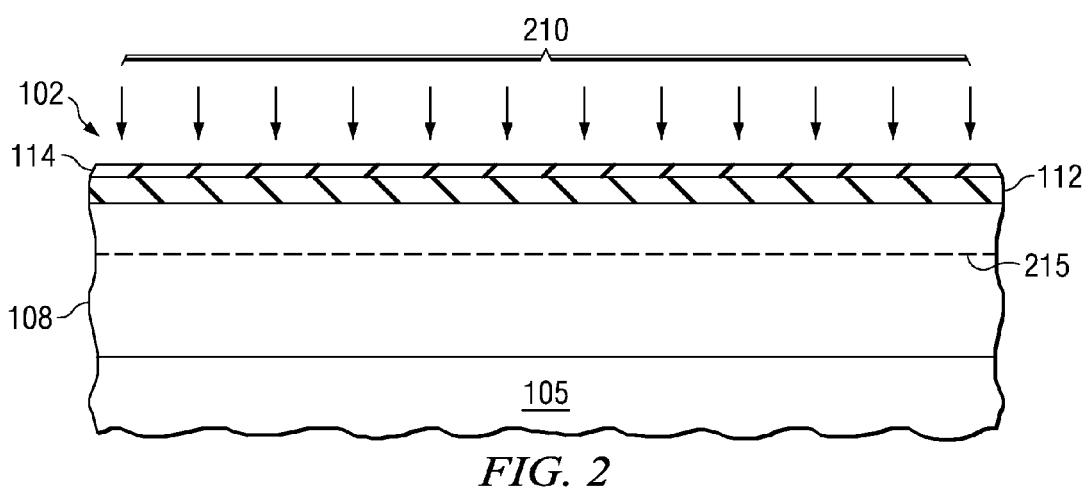
FIGS. 2-5 illustrate one method embodiment of how the substrate of FIG. 1A may be manufactured to arrive at a substrate of one crystal orientation having a strained layer having a different crystal orientation located thereon.

FIG. 2 illustrates an embodiment of the substrate 102 undergoing a hydrogen implant 210 for the purpose of forming a cleavage plane 215 in the doped portion 108. In certain embodiments, the cleavage plane 215 may be used to separate the strained silicon layer 112 from the substrate 105 and a substantial portion of the doped portion 108. Conventional processes may be used to form the cleavage plane 215. However, in other embodiments, the cleavage plane 215 may not be used. In such instances, other conventional cutting or ablation processes may be used to separate the strained silicon layer 112 from substrate 105 and doped portion 108.

Figure 3:
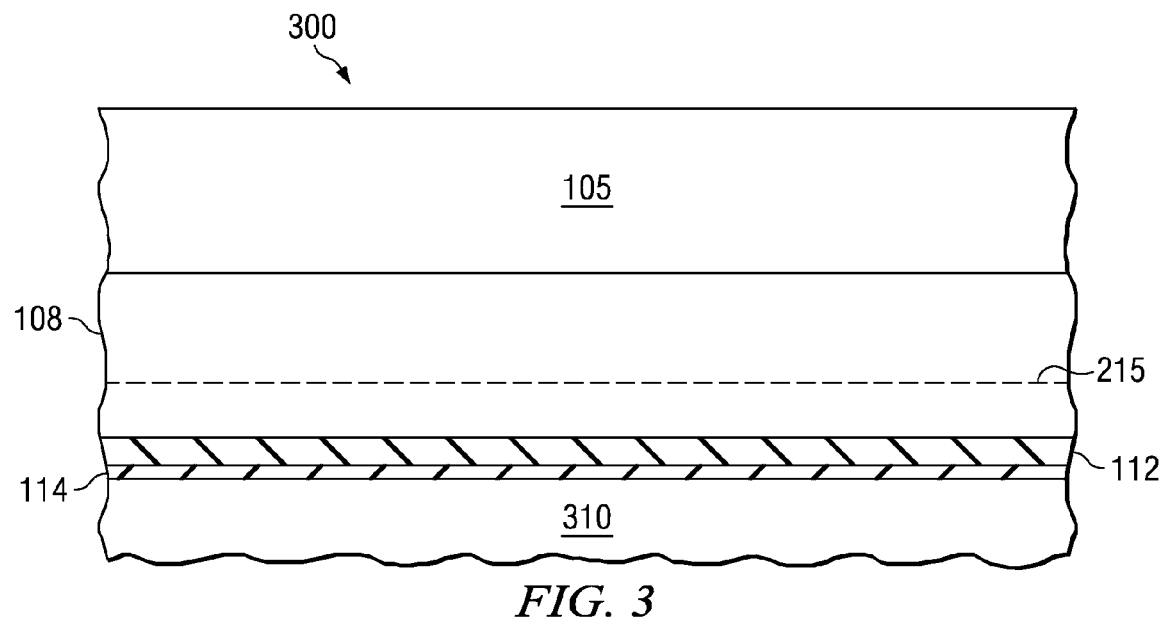

FIG. 3 illustrates an embodiment of a semiconductor device 300 where the substrate 102 of FIG. 2 is bonded to another substrate 310, such as a silicon wafer. It should be noted, however, that the substrates discussed herein may be any semiconductor substrate known to those skilled in the art. As seen in this embodiment, the two substrates 102 and 310 are joined at oxide layer 114, which is located between them. The substrate 310 has a crystal structure that is different from the crystal structure of the substrate 105 and the strained silicon layer 112. For example, in one embodiment, the substrate 105, the doped portion 108, and the strained silicon layer 112 may have a (100) crystal orientation, and the substrate 310 may have a (110) crystal structure. This arrangement is beneficial where optimization of both NMOS and PMOS devices is desired, inasmuch as a (100) strained substrate is beneficial for NMOS devices and a (110) substrate is beneficial for PMOS devices. The two substrates 102 and 310 may be bonded together by any conventional manner, however, in the illustrated embodiment, hydrophilic bonding may be used to bond substrates 102 and 310 together at the oxide layer 114.

Figure 4:
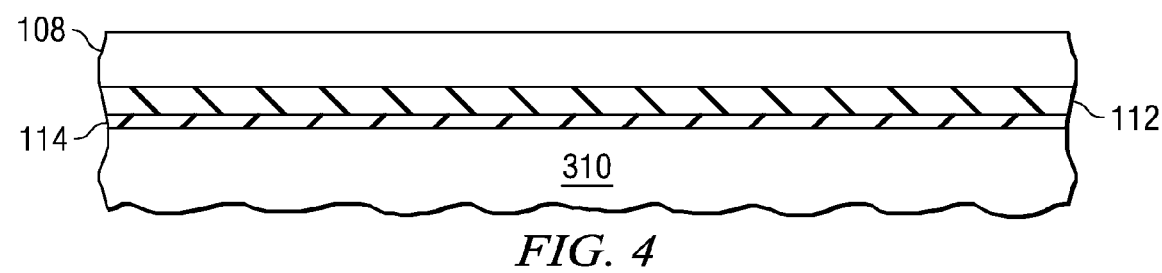

FIG. 4 illustrates the semiconductor device 300 after the removal of at least a part of the doped portion 108. In other embodiments, however, the entire doped portion 108 may be removed. In either embodiment, the removal leaves the strained silicon layer 112 on the substrate 310. Conventional processes may be used to remove the doped portion 108. As mentioned above, one embodiment provides for the formation of a cleavage plane within the doped portion 108. Conventional processes, such as SOITEC's SMART CUT™ that uses thermal activation as an atomic scalpel, can be used to cleave the doped portion 108 at the cleavage plane and remove the bulk of the substrate 105, which also includes the bulk of the doped portion 108, to form the device illustrated in FIG. 4. Other alternative methods that do not require the formation of the cleavage plane can also be used, such as the ELTRAN™ method that uses porous silicon that is formed by anodic etching or annealing to form the splitting layer.

Figure 5:
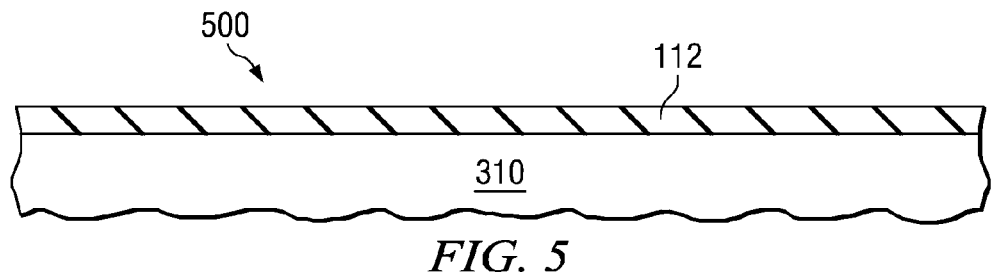

Once the bulk of the substrate 105 and the doped portion 108 are removed, conventional processes may be used to remove any remnants of the doped portion 108 and arrive at the device 500 of FIG. 5. For example, remnants of the doped portion 108 may be removed with an oxidation or wet etches process that selectivity removes silicon germanium. Further, in those embodiments where the oxide layer 114 is present, this layer may also be partially or completely removed using conventional processes, such as by using a thermal anneal in a reducing ambient in the range of about 1000° C. to about 1250° C. The temperature can be optimized to dissolve the oxide interface between the oxide layer 114 and the silicon layer 112 without substantially relaxing the strained silicon layer 112. Depending on the overall process flow, it may be desirable to leave a portion of the oxide layer 114 between the strained silicon layer 112 and the substrate 310 to prevent or reduce relaxation, for example, when higher process temperatures are used during the process flow. The partial or complete removal of the oxide layer 114 from between the strained silicon layer 112 and substrate 310 allows the crystal lattice of the strained silicon layer 112 to at least partially contact the crystal lattice of the substrate 310. Thus, in latter process steps as explained below, the strained silicon layer 112 is able to re-crystallize to match the crystal lattice of substrate 310. The removal of the oxide layer 114 results in the structure illustrated in FIG. 5. In one embodiment, the device 500 shown in FIG. 5 may be obtained from a supplier or may be manufactured in the manner discussed above. Thus, as used herein, "providing" includes either obtaining the device 500 from a supplier or fabricating the device 500.

Figure 6:
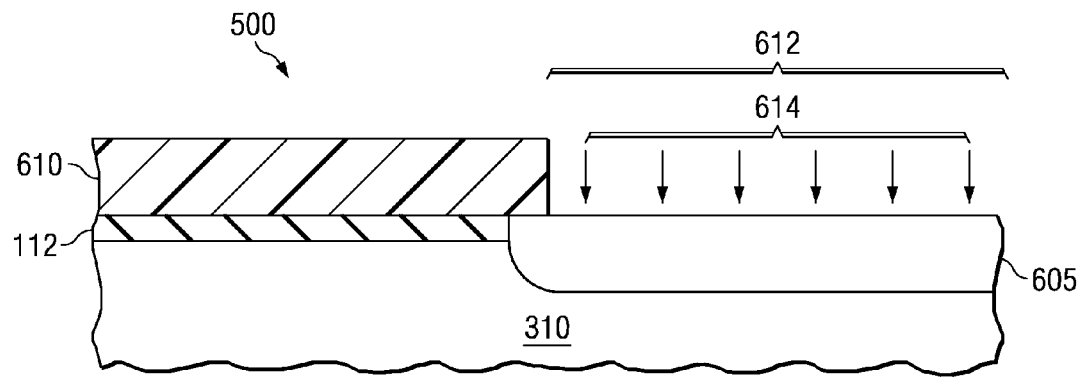
FIG. 6 illustrates the amorphization of an exposed portion of the strained silicon layer.

After the formation of the device 500, a portion of the strained silicon layer 112 is amorphized to a non-crystalline material 605. In one embodiment, this may be achieved by patterning a mask 610, such as a photoresist or hard mask, over the strained silicon layer 112, as shown in FIG. 6. The patterned mask 610 exposes a portion 612 of the strained silicon layer 112, which is subjected to an implant 614. The mask 610 protects regions of the device 500 where NMOS transistors will be formed and exposes region of the device 500 where PMOS transistors will be formed. In one embodiment, the implant 614 may comprise silicon, germanium, or a combination thereof. In such embodiments, the implant energy may range from about 50 keV to about 90 keV for silicon and from about 90 keV to about 140 keV for germanium. The dosage concentration of either of these dopants may be about $2.0E15/cm^2$. The amorphization should be thorough enough to break up the existing crystal structure to the extent necessary to allow the portion 612 to re-crystallize to an orientation that matches the underlying substrate 310. In those embodiments where a portion of the previously-discussed oxide layer 114 remains, the amorphization also breaks it up, further enhancing the re-crystallization.

Figure 7:
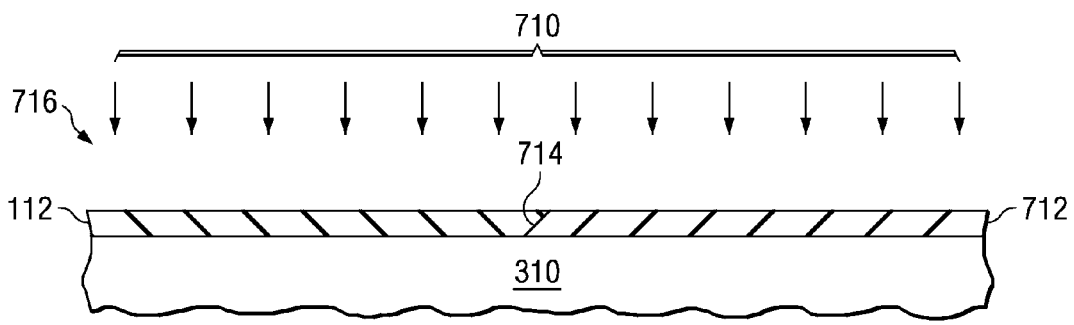
FIG. 7 illustrates a subsequent anneal that is conducted to re-crystallize the strained silicon layer to the crystal orientation of the underlying substrate.

Following the implant 614, and as seen in FIG. 7, an anneal 710, such as a solid phase epitaxy, is conducted to re-crystallize the amorphized portion of the strained silicon layer 112. In one embodiment, the anneal 710 may be conducted at a temperature ranging from about 500° C. to about 800° C. for about 2 hours in a nitrogen ambient, and in another embodiment, the temperature may range from about 600° C. to about 650° C. for about 2 hours in a nitrogen ambient. The anneal 710 causes the amorphized material 605 to re-crystallize to match the underlying crystal lattice. For example, if the substrate 310 is silicon and has a (110) crystal orientation, then the anneal 710 will cause the amorphized material 605 to re-crystallize into re-crystallized silicon material 712 that also has a (110) crystal orientation.

In certain embodiments, the anneal 710 may be followed by a high temperature anneal that is conducted at about 1050° C. for 2 hours in an ambient of nitrogen to eliminate or reduce residual damage that occurs at the border region 714 of the strained silicon layer 112 and the re-crystallized material 712. A lower thermal budget (e.g., lower temperature and/or less time) may also be used to optimize the elimination or reduction of the residual damage without substantially relaxing the strain. This damage may be further reduced or eliminated during the formation of shallow trench isolation structures. A sacrificial oxidation process may then be conducted to complete the orientation by removing border region defects. This oxidation may be a dry oxidation process conducted at about 1000° C. and 1.3% HCl.

The above-described embodiments result in a substrate 716 that includes a strained silicon layer 112 that is favorable for the manufacture of NMOS devices and a substrate 310 and 712 that are favorable for the manufacture of PMOS devices. In a more specific embodiment, the strained silicon layer 112 has a (100) crystal orientation and the substrate 310, over which the strained silicon layer 112 is located, and the re-crystallized material 712 has a (110) orientation. Thus, these embodiments provide a device that allows the optimization for both NMOS and PMOS devices. In addition, certain embodiments provide a device wherein the strained silicon layer 112 is substantially free of germanium (that is contains only trace amounts of germanium) and wherein germanium is present in the re-crystallized material 712.

Figure 8:
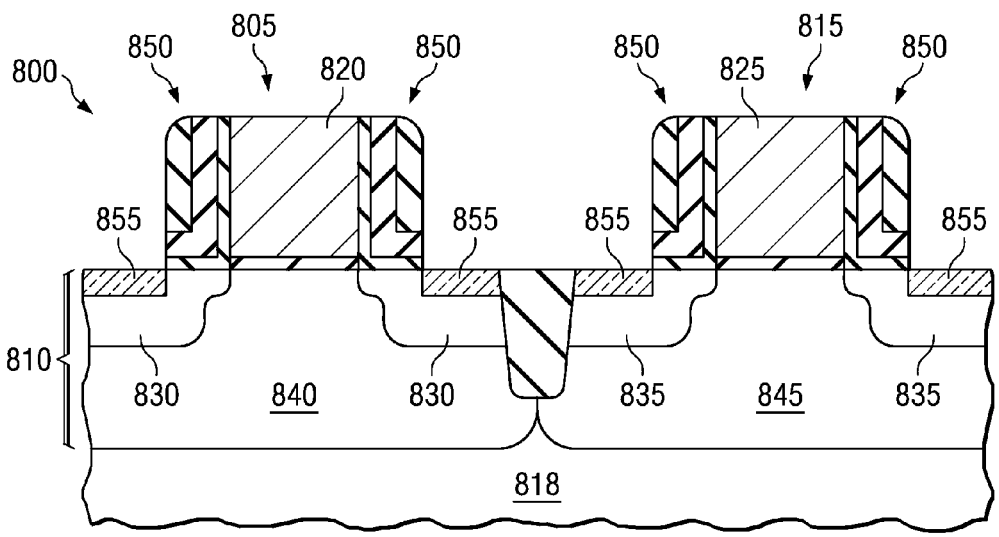
FIG. 8 illustrates NMOS and PMOS devices constructed on the strained silicon layer and re-crystallized strained silicon layer, respectively.

Upon the formation of the substrate 716, conventional processes may be used to fabricate a complementary device 800, as seen in FIG. 8. The illustrated embodiment includes an NMOS transistor 805 that is located over and within a (100) strained silicon layer 810, achieved by the processes discussed above, and a PMOS transistor 815 that is located over and within a (110) silicon substrate 818, achieved by the processes discussed above. It should be noted, however, that the (100) and (110) crystal orientations are given as examples only and that other crystal orientations may be used in other embodiments. The NMOS and PMOS transistor 805, 815 each may include conventional features, such as gate electrodes 820, 825, appropriately doped source/drains 830, 835 formed in complementary doped wells 840, 845 that are respectively formed in the strained silicon layer 810 and the substrate 818. Sidewall spacers 850 and silicided contacts 855 are located adjacent each of the gate electrodes 820 and 825.

Figure 9:
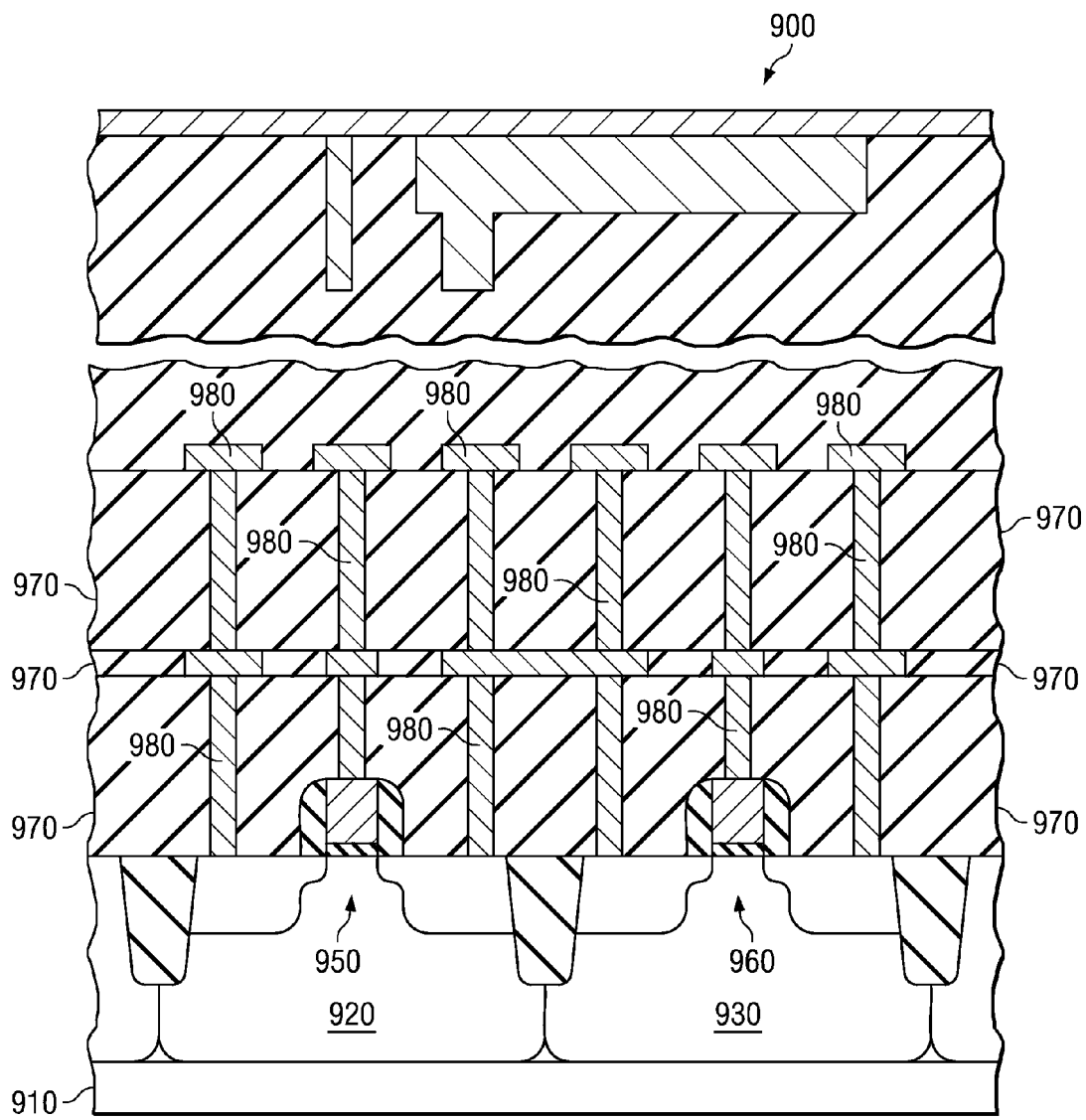
FIG. 9 illustrates an integrated circuit (IC) incorporating the semiconductor device of the disclosure.

FIG. 9 illustrates an integrated circuit (IC) 900 formed according to embodiments of the invention. The IC 900 is formed over a silicon substrate 910 having an NMOS portion 920 and a PMOS portion 930. In the illustrated embodiment, the NMOS portion 920 has a (100) crystal orientation, and the PMOS portion 930 has a (110) crystal orientation formed in the way described previously.

The IC 900 may include MOS, BiCMOS or bipolar components, such as NMOS and PMOS transistors 950 and 960, respectively, and may further include passive components, such as capacitors, inductors or resistors. It may also include optical components or optoelectronic components. Those skilled in the art are familiar with these various types of components and their manufacture. The IC 900 may also be a dual-voltage IC, comprising transistors operating with different threshold voltages.

Dielectric layers 970 are formed over the MOS transistors 950, 960, using currently known or later discovered methods. Conventional interconnect structures 980, such as damascene or dual damascene structures, both of which are illustrated, are located within and over the dielectric layers 970 to connect the various components, thus forming the integrated circuit 900. It will be apparent to one skilled in the art that several variations of the example interconnect architecture may be fabricated according to the invention with similarly advantageous results.

Those skilled in the art to which the disclosure relates will appreciate that other and further additions, deletions, substitutions, and modifications may be made to the described example embodiments, without departing from the disclosure.

What is claimed is:

1. A method of fabricating a semiconductor device, comprising:
   providing a strained silicon substrate comprising a first substrate, and a strained silicon layer formed with a (100) crystal orientation over the first substrate;
   forming an oxide layer of less than one monolayer thickness over the strained silicon layer;
   providing a second substrate having a surface silicon material with a (110) crystal orientation;
   bonding the strained silicon substrate at the oxide layer to the surface silicon material of the second substrate thereby providing a composite structure;
   removing the first substrate from the composite structure and dissolving the oxide layer, leaving the strained silicon layer with the (100) crystal orientation in contact with the second substrate silicon material with the (110) crystal orientation;
   masking the strained silicon layer to cover an NMOS region and to leave exposed a PMOS region;
   implanting the exposed PMOS region with silicon or germanium, or both, to amorphize the strained silicon layer at the exposed PMOS region;
   re-crystallizing the amorphized PMOS region using solid phase epitaxy to match the (110) crystal orientation of the second substrate silicon material in the re-crystallized PMOS region;
   unmasking the covered NMOS region;
   forming an NMOS device at the NMOS region; and
   forming a PMOS device at the re-crystallized PMOS region.

2. The method of claim 1, wherein providing the strained silicon substrate further comprises providing a graded germanium, strained silicon substrate including the first substrate including silicon material having a (100) crystal orientation and a doped portion produced by a graded deposition process; and the strained silicon layer formed over the doped portion.

3. The method of claim 2, wherein the doped portion is doped with $Si_{0.8}Ge_{0.2}$ and the germanium concentration is from about 15% to about 20% by atomic percent.

4. The method of claim 2, wherein hydrophilic bonding is used to bond the strained silicon substrate at the oxide layer to the surface silicon material of the second substrate.

5. The method of claim 4, wherein providing the graded germanium, strained silicon substrate further includes a hydrogen implant forming a cleavage plane; and removing the substrate from the composite structure comprises separating the strained silicon layer from a substantial portion of the doped portion of the first substrate by cleaving at the cleavage plane, and using an oxidation or wet etch to remove any remnants of the doped portion.

6. The method of claim 5, wherein re-crystallizing the amorphized PMOS region comprises performing a first anneal to re-crystallize amorphized portions of the strained silicon layer to match underlying crystal lattice of the surface silicon material of the second substrate; and performing a second anneal to reduce residual damage at a border region of re-crystallized and other portions of the strained silicon layer.

7. A method of fabricating an integrated circuit, comprising:
   forming a strained silicon layer with one of a (100) or (110) crystal orientation over a first substrate;

forming an oxide layer over the strained silicon layer, the oxide layer being less than one monolayer thick;

bonding the first substrate and the strained silicon layer at the oxide layer to a second substrate comprising a semiconductor material having a crystal lattice with the other of the (100) or (110) crystal orientation;

removing the first substrate from the strained silicon layer, leaving the strained silicon layer bonded to the second substrate;

selectively implant amorphizing a portion of the strained silicon layer at least partially in contact with the semiconductor material crystal lattice of the second substrate, to transform the amorphized portion to a non-crystalline material; and conducting an anneal to re-crystallize the non-crystalline material to match the other of the (100) or (110) crystal orientation of the semiconductor material crystal lattice of the second substrate.

8. The method of claim 7, wherein the oxide layer is at least partially removed by annealing subsequent to bonding the first substrate to the second substrate, and prior to selectively amorphizing the portion of the strained silicon layer.

9. The method of claim 8, wherein the annealing prior to selectively amorphizing is a thermal anneal at a temperature of 1000° C. to 1250° C. conducted for a time that dissolves an oxide interface between the oxide layer and the strained silicon layer, without relaxing the strained silicon layer.

10. The method of claim 8, wherein the strained silicon layer has a (100) crystal orientation, and the second substrate semiconductor material comprises silicon having a (110) crystal orientation.

11. The method of claim 7, wherein the strained silicon layer has a (100) crystal orientation, and the second substrate semiconductor material comprises silicon having a (110) crystal orientation.

12. The method of claim 7, wherein the first substrate comprises a silicon substrate having the one of the (100) or (110) crystal orientation and including a doped portion produced by a graded deposition process wherein a germanium concentration is increased from about 0% to 20% atomic percent; and the strained silicon layer with the one of the (100) or (110) crystal orientation is formed over the doped portion.

13. The method of claim 7, wherein the oxide layer formed over the strained silicon layer is a second oxide layer; the first substrate comprises a silicon substrate with a first oxide layer formed thereover; and the strained silicon layer is formed over the first oxide layer.

14. The method of claim 7, wherein removing the first substrate from the strained silicon layer comprises removing at least a portion of the first substrate along a hydrogen implanted cleavage plane.

15. The method of claim 7, wherein bonding the first substrate and the strained silicon layer at the oxide layer to the second substrate comprises hydrophilic bonding.

16. The method of claim 7, wherein the strained silicon layer has a (100) crystal orientation; the second substrate semiconductor material comprises silicon having a (110) crystal orientation; and the selectively implant amorphizing comprises using a patterned photomask layer to leave the portion of the strained silicon layer exposed while covering another portion of the strained silicon layer, and implanting the exposed portion with an implant comprising silicon, germanium, or a combination thereof.

17. The method of claim 7, wherein forming the strained silicon layer comprises forming the strained silicon layer with a (100) crystal orientation; and the re-crystallized material has a (110) crystal orientation; and further comprising:

forming an NMOS transistor at an unamorphized portion of the strained silicon layer having the (100) crystal orientation; and forming a PMOS transistor at an amorphized and re-crystallized portion of the strained silicon layer having the (110) crystal orientation.

18. The method of claim 7, wherein the implant amorphizing comprises implanting silicon or germanium, or a combination thereof, into an exposed portion of the strained silicon layer with an implant energy ranging from about 50 keV to about 90 keV for silicon and from about 90 keV to about 140 keV for germanium, with a dosage concentration for either silicon or germanium of about 2.0E15 atoms/cm$^2$.

19. The method of claim 7, wherein the anneal is conducted at a temperature within a range of from about 600° C. to about 650° C. for about 2 hours in the presence of nitrogen gas.

20. The method of claim 7, further including conducting an oxidation subsequent to the re-crystallizing to remove border region defects between the strained silicon layer and the re-crystallized portion.

21. A method of fabricating an integrated circuit, comprising:

providing a first substrate, a strained silicon layer with one of a (100) or (110) crystal orientation formed over the first substrate, and an oxide layer being less than one monolayer thick formed over the strained silicon layer;

bonding the first substrate and the strained silicon layer at the oxide layer to a second substrate comprising a semiconductor material having a crystal lattice with the other of the (100) or (110) crystal orientation;

removing the first substrate from the strained silicon layer, leaving the strained silicon layer bonded to the second substrate at least partially in contact with the semiconductor material crystal lattice of the second substrate;

selectively implant amorphizing a portion of the strained silicon layer at least partially in contact with the semiconductor material crystal lattice of the second substrate, to transform the amorphized portion to a non-crystalline material; and conducting an anneal to re-crystallize the non-crystalline material to match the other of the (100) or (110) crystal orientation of the crystal lattice of the semiconductor material of the second substrate.

22. The method of claim 21, wherein the first substrate comprises silicon material having a crystal lattice with the one of the (100) or (110) crystal orientation; and the second substrate comprises silicon material having the crystal lattice with the other of the (100) or (110) crystal orientation.

23. The method of claim 22, wherein the one of the (100) or (110) crystal orientation is the (100) crystal orientation; the other of the (100) or (110) crystal orientation is the (110) crystal orientation; and further comprising:

forming an NMOS transistor at an unamorphized portion of the strained silicon layer having the (100) crystal orientation; and forming a PMOS transistor at an amorphized and re-crystallized portion of the strained silicon layer having the (110) crystal orientation.

* * * * *